(12) United States Patent
Mukherjee et al.

(10) Patent No.: US 11,581,897 B1
(45) Date of Patent: Feb. 14, 2023

(54) DUAL SLOPE DIGITAL-TO-TIME CONVERTERS AND METHODS FOR CALIBRATING THE SAME

(71) Applicant: TEXAS INSTRUMENTS INCORPORATED, Dallas, TX (US)

(72) Inventors: Subhashish Mukherjee, Bangalore (IN); Jayawardan Janardhanan, Bangalore (IN); Yogesh Darwhekar, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 18 days.

(21) Appl. No.: 17/377,698

(22) Filed: Jul. 16, 2021

(51) Int. Cl.
| | |
|---|---|
| *H03M 1/10* | (2006.01) |
| *G04F 10/00* | (2006.01) |
| *H03K 5/135* | (2006.01) |
| *H03K 5/00* | (2006.01) |

(52) U.S. Cl.
CPC ........ *H03M 1/1033* (2013.01); *G04F 10/005* (2013.01); *H03K 5/135* (2013.01); *H03K 2005/00052* (2013.01)

(58) Field of Classification Search
CPC .... H03M 1/1033; G04F 10/005; H03K 5/135; H03K 2005/00052
USPC ................................................ 341/120, 152
See application file for complete search history.

(56) References Cited

U.S. PATENT DOCUMENTS

| | | | |
|---|---|---|---|
| 9,362,936 B1 * | 6/2016 | Caffee | H03K 5/135 |
| 9,531,394 B1 * | 12/2016 | Caffee | H03L 7/081 |
| 2018/0131378 A1 | 5/2018 | Haroun et al. | |

* cited by examiner

*Primary Examiner* — Khai M Nguyen
(74) *Attorney, Agent, or Firm* — Valerie M. Davis; Frank D. Cimino

(57) ABSTRACT

A digital-to-time converter (DTC) and methods of calibrating the same reduces or mitigates nonlinearity and thus improves DTC performance. A slope of a voltage signal of the DTC is calibrated using a capacitor and a comparator. Capacitance of the capacitor and/or maximum current of a current source is adjusted to configure the comparator to output a signal during a second phase when a reference voltage signal is at or above a first level and below a second level. Calibrating gain of the DTC includes adjusting a time difference between an output signal of the DTC set at a first digital code value and the output signal of the DTC set at a second digital code value to be one period of a clock signal input to the DTC. Calibrating integral nonlinearity of the DTC includes measuring a time period for each of multiple digital code values of the DTC.

21 Claims, 10 Drawing Sheets

DUAL SLOPE DIGITAL-TO-TIME CONVERTERS AND METHODS FOR CALIBRATING THE SAME

FIELD OF DISCLOSURE

This disclosure relates generally to calibration of digital-to-time converters (DTCs), and in particular to on-chip digital calibration of dual-slope DTCs.

BACKGROUND

A DTC including a phase interpolator is a key building block in many applications. For example, a DTC may be used in a Phase Lock Loop (PPL) system. In another example, a DTC may be a component of a fractional output divider (FOD), which may be used at the output of a Bulk Acoustic Wave (BAW) oscillator to generate a required output frequency.

In an FOD, the DTC synthesizes fine time edges by interpolating between input clock edges. A particular synthesized edge output may be determined based on the input from a digital controller. The accuracy of a DTC depends on several parameters including input clock frequency, output clock frequency, number of interpolated edges, and jitter requirement.

Beyond a certain accuracy level, DTC performance is limited by, for example, component mismatch, process, temperature and supply voltage variations, as well as analog impairments. In the context of a BAW system, jitter performance of the BAW oscillator is dominated by the FOD. The requirements may be quite tight (e.g., <125 femtoseconds of jitter with area and power constraints). A DTC with high-performance level is needed in this and other applications.

A solution is thus desirable.

SUMMARY

In accordance with an example, a method of calibrating a digital-to-time converter (DTC) is provided. The method comprises calibrating a slope of a voltage signal of the DTC including charging a capacitor using a current source set according to a control value (e.g., α) set at a first digital code value (e.g., 0 code) for a first phase, stop charging the capacitor, comparing the voltage signal with a reference voltage signal (e.g., $V_{REF}$) using a comparator, and adjusting at least one of capacitance of the capacitor and maximum current of the current source to configure the comparator to output a signal during a second phase when the reference voltage signal is at or above a first level (e.g., $V_{TH2}$) and below a second level (e.g., $V_{TH3}$) which is higher than the first level; calibrating a gain of the DTC including adjusting a time difference between output of the comparator when the control value is set at the first digital code value and output of the comparator when the control value is set at a second digital code value (e.g., full code) to be one period of a clock signal input to the DTC; and calibrating integral nonlinearity (INL) of the DTC including measuring a time period for each of multiple digital code values of the DTC.

In accordance with an example, a digital-to-time converter (DTC) comprises a phase interpolator including a current source and a charging element; and a digital calibration engine coupled to the phase interpolator, the digital calibration engine including a digital-to-analog converter (DAC) to set a value of a digital code of the DTC to any of multiple values between 0 code and full code to control the current source during during digital calibration of a slope of a voltage signal of the DTC, gain of the DTC, and integral nonlinearity (INL) of the DTC.

In accordance with an example, a system comprises a digital-to-time converter (DTC), a calibration DTC, a latch comparator, and a state machine. The DTC has an input at which a first clock signal is received and an output at which a DTC output signal is output. The calibration DTC has an input at which a second clock signal is received and an output at which a calibration DTC output signal is output. The latch comparator has inputs at which the DTC and calibration DTC output signals are received, respectively, and an output at which a comparative signal indicative of which of the DTC output signal and the calibration DTC output signal is received first. The state machine has an input at which the comparative signal is received, the state machine being configured to control the DTC and calibration DTC based on the comparative signal.

In accordance with an example, a system comprises a phase interpolation, first and second delays, and a digital-to-analog converter (DAC). The phase interpolator has a current source and an output at which an oscillation signal is output. The first delay has an input coupled to the output of the phase interpolator and an output at which a first calibration signal output. The second delay having an input coupled to the output of the first delay and an output at which a second calibration signal is output, the second calibration signal being delayed by a set amount relative to the first calibration signal. The DAC is coupled to the phase interpolator, and the DAC is configured to vary a digital code that controls the current source to change the period of the oscillation signal during calibration.

These and other features will be better understood from the following detailed description with reference to the accompanying drawings.

BRIEF DESCRIPTION OF THE DRAWINGS

Features of the disclosure may be understood from the following figures taken in conjunction with the detailed description.

The same reference numbers are used in the drawings to designate the same or similar (structurally and/or functionally) features.

DETAILED DESCRIPTION

Figure 1:
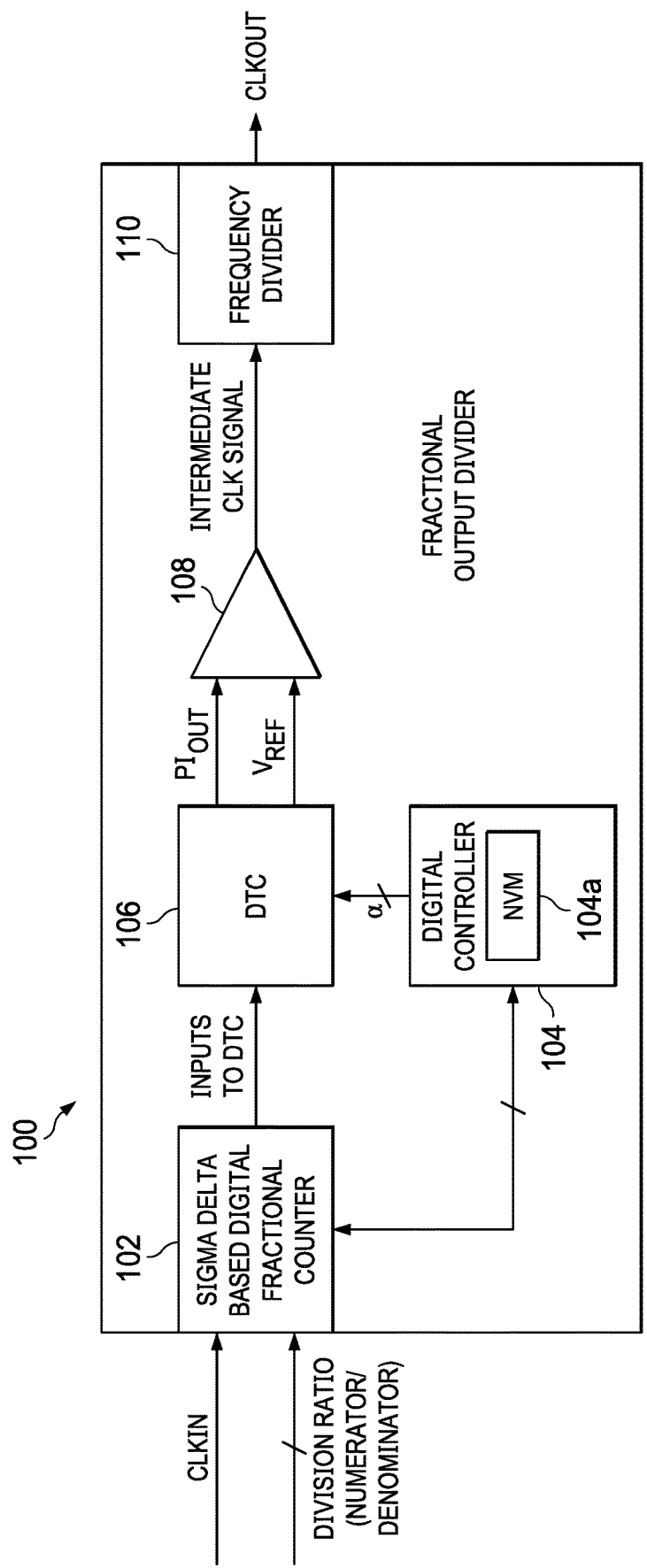
FIG. 1 is a schematic diagram of an example system that includes a digital-to-time converter (DTC).

Specific examples are described below in detail with reference to the accompanying figures. These examples are not intended to be limiting. The objects depicted in the drawings are not necessarily drawn to scale.

In an example, a digital-to-time converter (DTC) is digitally calibrated to improve performance. In an example, the DTC has dual-slope-based architecture. In an example, a system, e.g., system-on-chip (SoC) that includes a dual-slope DTC (DSDTC), is configured to enable on-chip calibration of the DSDTC, e.g., on-chip linearity measurement and correction. Such system is also configured to deliver improved performance characteristics, e.g., less jitter, and to support a broader range of frequencies.

Digital calibration of a DTC, e.g., a DSDTC, according to examples provided herein, reduces or mitigates nonlinearity that arises because of static and dynamic effects of current source and switch characteristics, as well as component mismatch. In examples, slope, gain and integral nonlinearity (INL) are measured and calibrated.

FIG. 1 is a schematic diagram of a system 100, which may be fractional output divider (FOD) that receives an input clock signal (CLKIN) and outputs a clock out signal (CLKOUT) that has a frequency equal to a specified fraction of (CLKIN). Input clock signal (CLKIN) may have any suitable frequency, e.g., 10 MHz to 10 GHz.

FOD 100 operates by counting a specified number of clock periods of CLKIN that is the desired approximate period of CLKOUT, and then interpolates an amount of time between edges of CLKIN to produce the period of length between edges of CLKOUT. That is, FOD 100 synthesizes fine time edges by interpolating between CLKIN edges and outputs CLKOUT with the fine edges.

Within FOD 100, a sigma delta digital fractional counter 102 receives CLKIN and a division ratio, which may be a fraction. Counter 102 may count a number of edges of CLKIN specified by the division ratio and produce corresponding signals that form the inputs to DTC 106, and more particularly inputs to a phase interpolator (PI), which is described in more detail below in connection with FIG. 3. Counter 102 is in bidirectional communication with digital controller 104, which may include a nonvolatile memory (NVM) 104*a* that may be used in aspects of the calibration as described below. Counter 102 may count both the rising and falling edges of CLKIN. The PI of DTC 106 is configured to interpolate between two edges of CLKIN as specified by a phase parameter α received from digital controller 104. For example, for a specified divider ratio of 13.75, digital controller 104 may instruct counter 102 to count 13 edges (where 13 is the integer portion of the divider ratio) of CLKIN and instruct the PI of DTC 106 to interpolate 0.75 (α=0.75) of a period of CLKIN before comparator 108 asserts an intermediate clock signal. On the next output period, digital controller 104 may instruct counter 102 to count 13 input periods and instruct the PI of DTC 106 to interpolate between half of a period of CLKIN. The intermediate clock signal may then be divided by two by a frequency divider 110 to form output clock signal (CLKOUT) with a period of 13.75 periods of CLKIN. This process is then repeated for each period of CLKOUT. Typically, each period requires a different amount of phase interpolation, because the fractional frequency ratio causes the edge relationships between CLKIN and CLKOUT to continually change.

In this example, phase parameter α is an 11-digit value, but α may have a higher or lower resolution than 11-bits. The PI of DTC 106 generates a voltage ($PI_{OUT}$) that correlates to a requested phase shift amount indicated by α. $PI_{OUT}$ may be compared to a reference voltage ($V_{REF}$) by comparator 108. A transition on CLKOUT is produced by comparator 108 when $PI_{OUT}$ is equal to $V_{REF}$, as described in more detail below with respect to FIG. 3.

Figure 2:
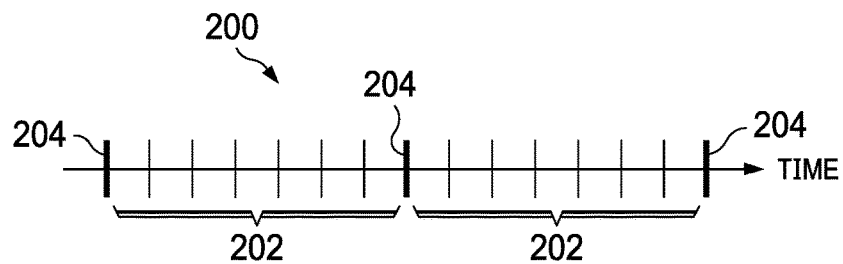
FIG. 2 is a diagram showing an example signal output by a DTC.

FIG. 2 is a diagram showing an example clock signal 200 with synthesized edges 202. DTC 106 synthesizes multiple edges 202 between each pair of adjacent input clock edges 204 to generate a fine grid. In an example, input clock signal (CLKIN) may have a frequency of 2.5 GHz, and output clock signal (CLKOUT) may have a frequency of 400 MHz with 4096 synthesized edges (12-bit) between adjacent edges of the input signal and 100 fs jitter. In an example, such synthesis may be performed by the PI, e.g., of DTC 106. An example PI is described below in connection with FIG. 3.

Figure 3:
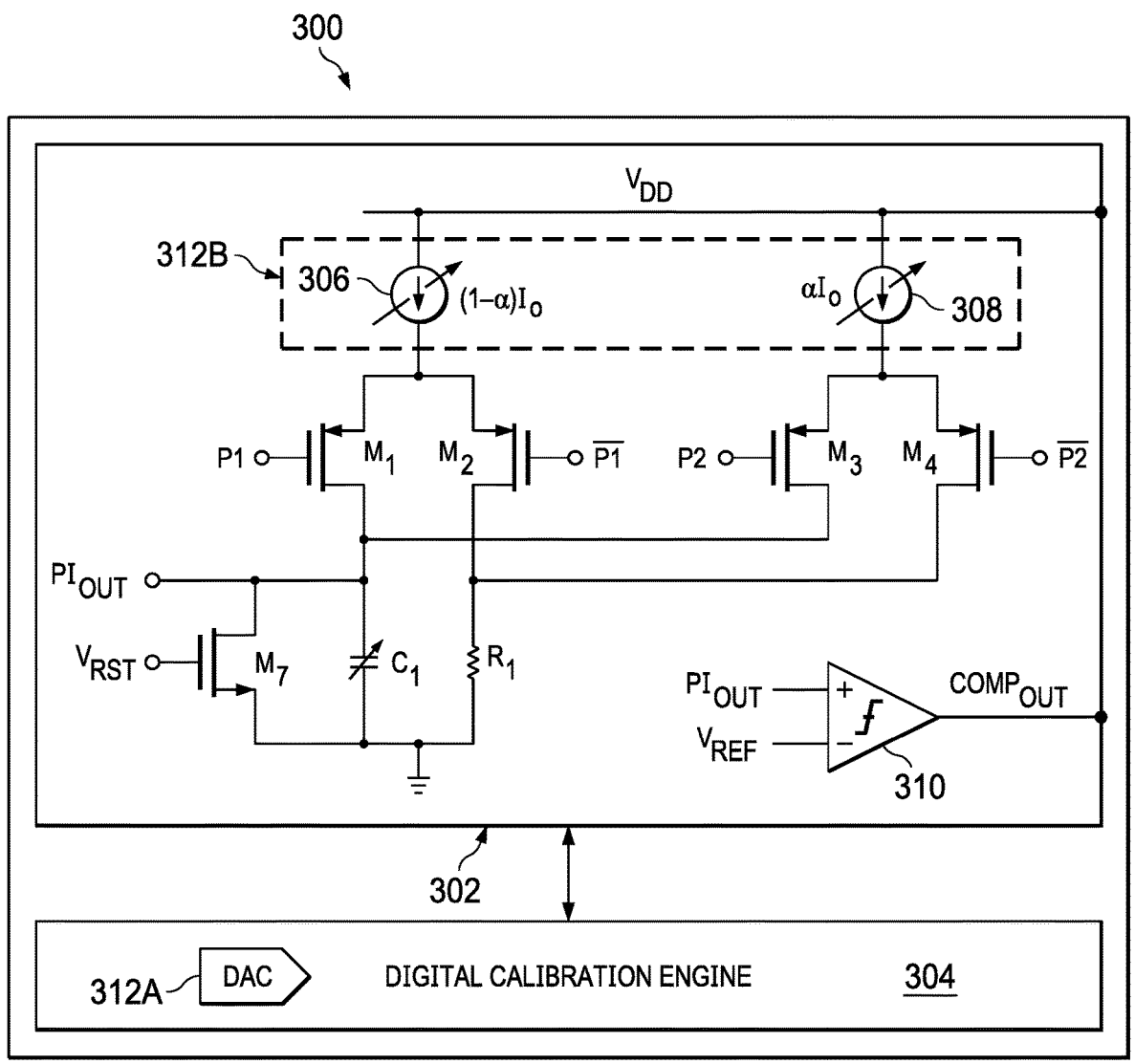
FIG. 3 is a schematic diagram of an example dual-slope DTC (DSDTC) that includes an example phase interpolator (PI).
Figure 4:
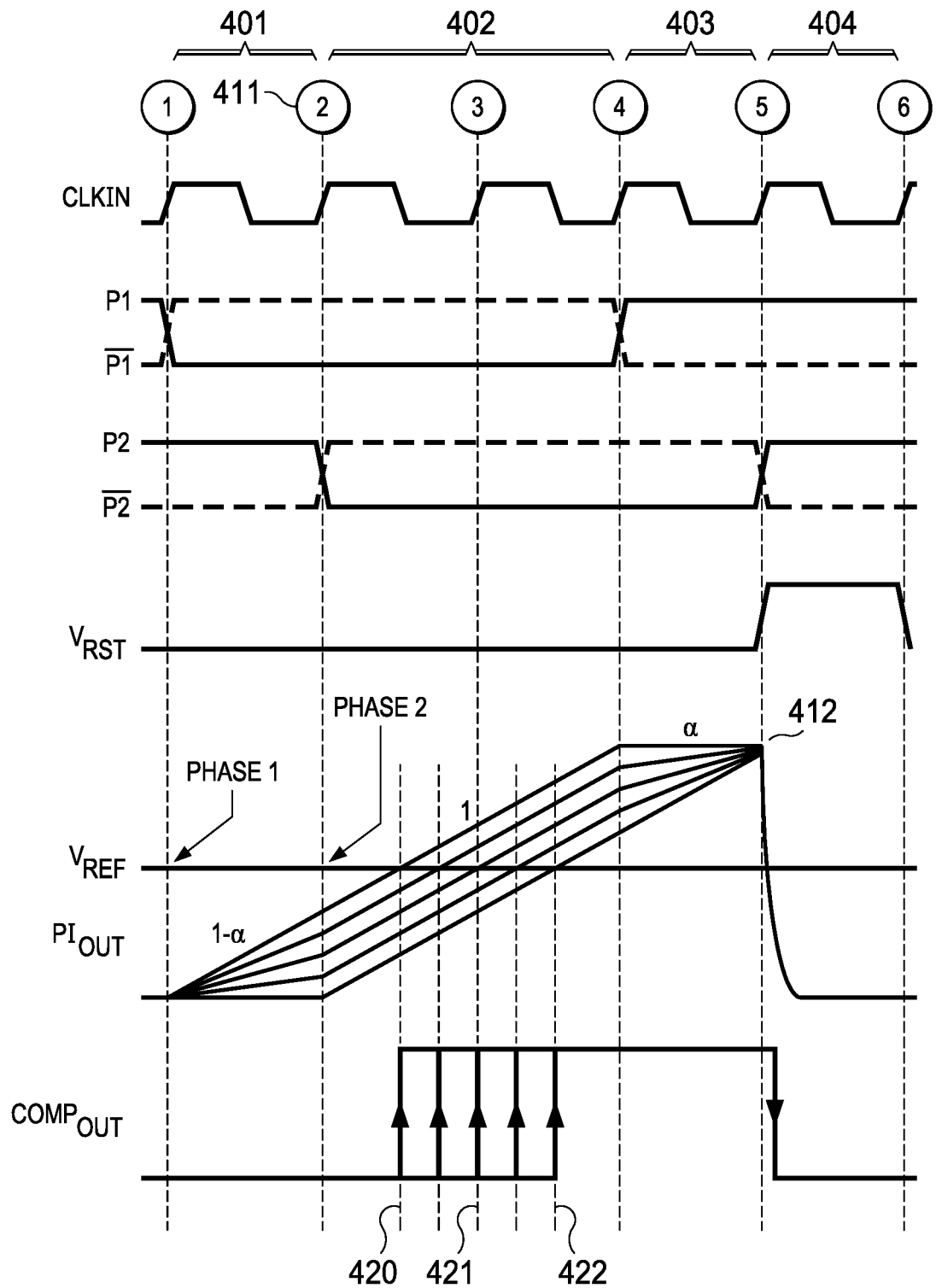
FIG. 4 are example timing diagrams of signals applied and generated during an exemplary operation of the PI of FIG. 3.

FIG. 3 shows a dual-slope DTC (DSDTC) 300 that includes a PI 302, which may operate in accordance with the timing diagrams of FIG. 4. PI 302 is configured to interpolate between two edges of the clock input signal (CLKIN) as specified by phase parameter α, which may be provided by a digital portion 312A of a digital-to-analog converter (DAC) 312 in digital calibration engine 304, which may be part of DSDTC 300. Phase parameter α may be loaded into a register within or coupled to DAC 312 by, for example, execution of instructions, by initialization circuitry, etc. In an example, α is a fractional value ranging from 0.0 to 1.0 that represents a percentage of a time period to shift the phase of output clock signal (CLKOUT) with respect to the input clock signal (CLKIN).

During each interpolation cycle, a first current source 306 is configured to produce current $(1-\alpha)I_o$, and a second current source 308 is configured to produce a current $\alpha I_o$. Current sources 306 and 308 may be implemented with the analog portion 312B (shown by the dashed enclosure) of DAC 312 which controls the value of α. In an example, DAC 312 has a resolution of 12 bits. In other examples, a different resolution may be used.

As shown in the timing diagrams of FIG. 4, during a first time period 401 representing Phase 1, the current from current source 306 is provided to ramp capacitor C1 via MOS transistor M1, while the current from current source 308 is dissipated by resistor R1 via MOS transistor M4. The current from current source 306 charges ramp capacitor C1 and produces a voltage ($PI_{OUT}$) that ramps up with a slope that is proportional to $(1-\alpha)$ during first time period 401. At time 411, $PI_{OUT}$ is proportional to the requested phase shift. In an example, phase 1 corresponds to one period or cycle of the input clock signal (CLKIN).

During a second time period 402 representing Phase 2, the current proportional to a from current source 308 is also provided to ramp capacitor C1 via MOS transistor M3, such that the total current provided to capacitor C1 during time period 402 is full scale, i.e., $\alpha+(1-\alpha)=1$. Thus, during time period 402 (Phase 2) a constant rate of charge is produced that is independent of α. Thus, $PI_{OUT}$ ramps up with a slope that is independent of α during time period 402 and is offset by $PI_{OUT}$ at time 411. In this manner, a two-step (i.e., dual slope) voltage ramp signal is produced in which the first step produces a voltage magnitude proportional to a requested phase shift at time 411 and in which the second step allows an output signal that has the requested phase shift to be produced based on the voltage magnitude at time 411.

During a third time period 403, the current from current source 306 is diverted to ground through resistor R1 by MOS transistor M2 so that ramp capacitor C1 charges at a rate proportional to α during time period 403. In this manner, ramp capacitor C1 is charged to the same full charge voltage level as indicated by 412 during each repetition of the interpolation cycle regardless of the value of α.

A reference voltage ($V_{REF}$) has a value approximately half of full charge voltage 412, which is the maximum voltage at time 412. A comparator 310 compares $PI_{OUT}$ to $V_{REF}$ during the second time period 402 to generate an output clock signal ($COMP_{OUT}$) that has a phase shift relative to the input clock signal (CLKIN) and that is very linear with respect to parameter α. For example, when α=0, $COMP_{OUT}$ asserted at time 420 has a phase shift of 0 degrees relative to CLKIN. When α=0.5, $COMP_{OUT}$ asserted at time 421 has a phase shift of 180 degrees relative to CLKIN. When α=1, $COMP_{OUT}$ asserted at time 422 has a phase shift of 360 degrees relative to CLKIN. Thus, any of multiple phase shift amounts between 0 and 360 degrees may be produced by a corresponding selection of parameter α.

By creating vertical voltage and horizontal time spacing using the same current, gain (full time scale) dependence on $I_o$ and C1 is eliminated.

During time period 404, ramp capacitor C1 is discharged to ground by MOS transistor M7.

MOS transistors M1, M2, M3, M4 and M7 are controlled by voltages P1, $\overline{P1}$ P2, $\overline{P2}$ and $V_{RST}$, respectively, which are shown with respect to the time periods and phases described above. These voltages may be provided by counter 102 as the inputs to DSDTC 300.

Figure 5:
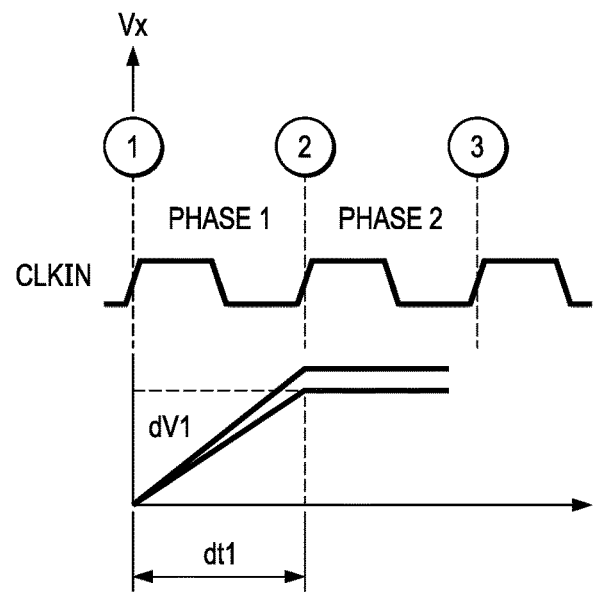
FIG. 5 is a graph illustrating an example of calibrating the slope of a DTC with respect to phases of a clock signal.

DTCs, such as DSDTC 300, however, are subject to various non-idealities including variation of the slope of $PI_{OUT}$. To improve performance, the slope, as well as gain and integral nonlinearity (INL), are measured and calibrated. $PI_{OUT}$ during Phase 1, represented by ramp slope (dV1/dt1) in FIG. 5, is calibrated for optimum performance. If the slope is too fast (steep), comparator 310 can trip, i.e., be activated, while in Phase 1, leading to functional error. If the slope is too slow (gradual), comparator 310 may not trip at all, which also leads to failure.

Figure 6:
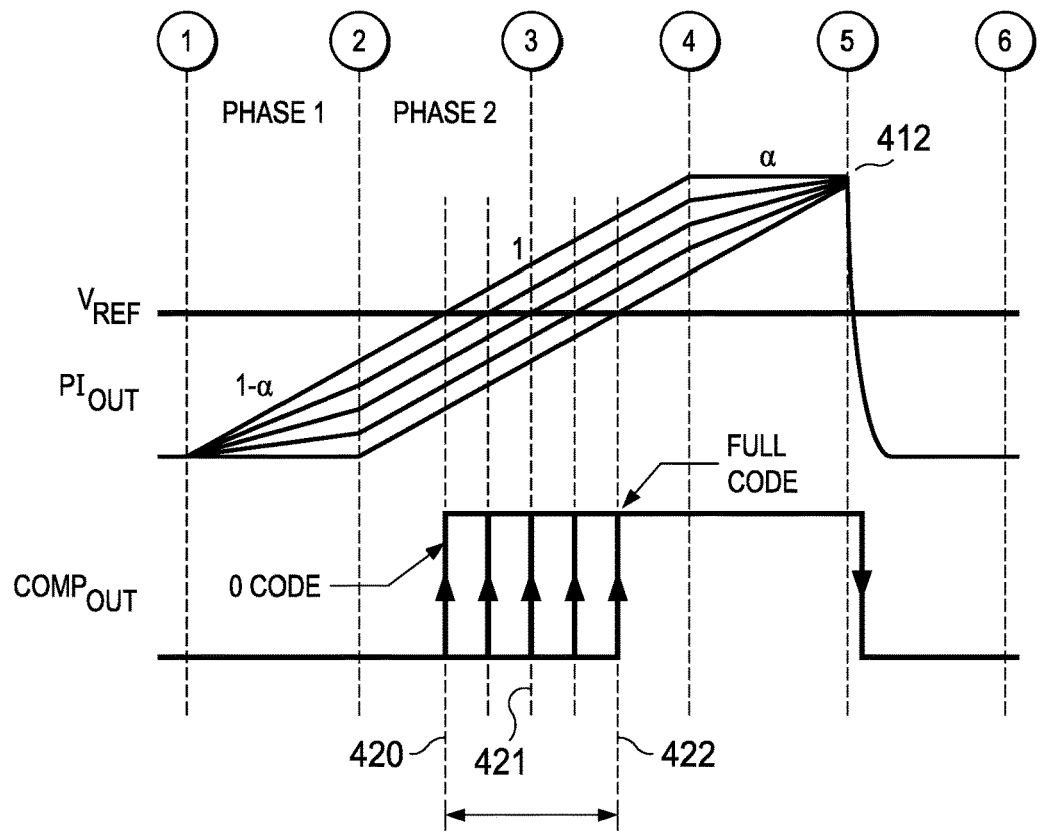
FIG. 6 is a graph showing the time difference (delta) between a current-controlling digital-to-analog converter (DAC) being set at 0 code and at full code.

With regard to gain, as shown in FIG. 6, the time difference (indicated by the bidirectional arrow) between an edge in $COMP_{OUT}$ with DAC 312 set at 0 code and a corresponding edge of $COMP_{OUT}$ with DAC 312 set at full code should be exactly one period of the input clock signal (CLKIN). Any deviation is called gain error.

Figure 7:
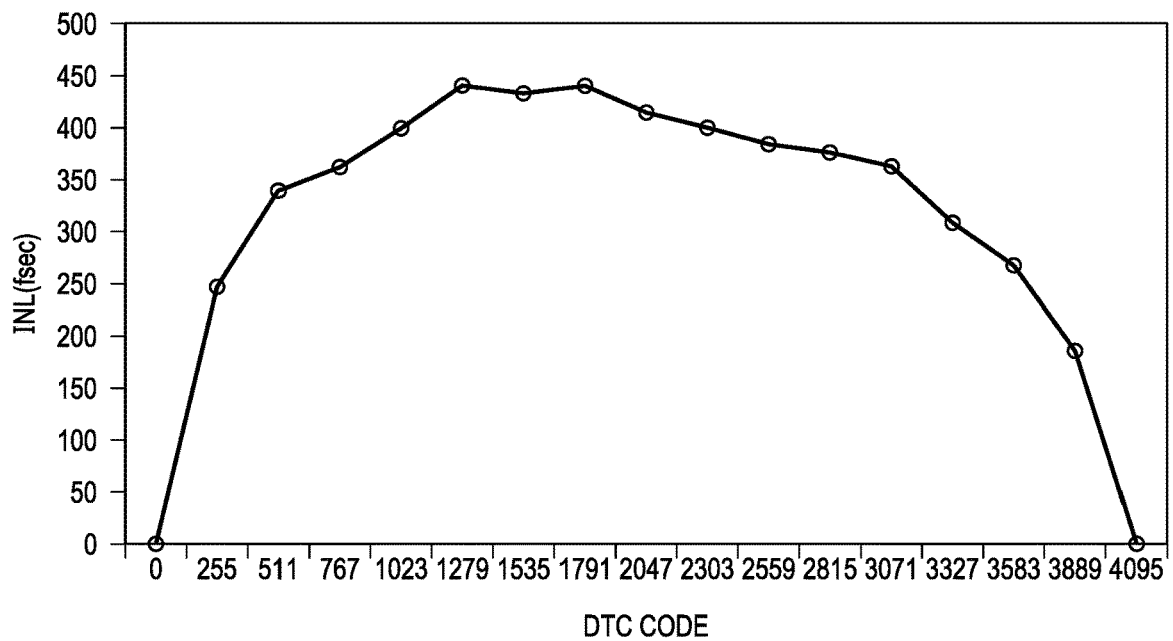
FIG. 7 is a graph of an example of integral nonlinearity (INL) with respect to DAC digital code.

FIG. 7 illustrates simulation operation of PI 302 of DSDTC 300 in which INL is given in femtoseconds (fsec) and measured against the DTC (or DAC) digital code. With respect to INL, the delay of the output signal of DSDTC 300, e.g., $COMP_{OUT}$, with respect to CLKIN, when plotted against DTC digital code should be linear. Any deviation, after gain correction, is called INL error.

In an example, calibration of DSDTC 300 includes two aspects: measurement of non-idealities and correction thereof. Measurement is performed with a fully functional system to capture dynamic errors, as well as static errors. In an example, correction is done to achieve femtosecond (fs) accuracy, in which case circuits and schemes are chosen such that no additional delay is added during measurement of non-idealities. Any component that adds delay, e.g., even a single additional gate which adds 10's of picoseconds, should be avoided. In an example, the slope of DSDTC 300 may be calibrated first, followed by gain, and then INL.

Figure 8:
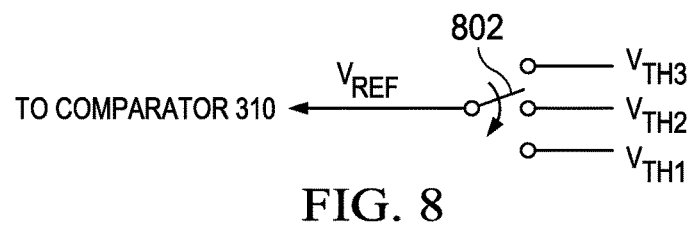
FIGS. 8 and 9 are a schematic diagram and a graph, respectively, showing an aspect of an example method of calibrating the slope of an example DTC.

In calibrating the slope, $V_{REF}$ is divided into three levels: $V_{TH1}$, $V_{TH2}$ and $V_{TH3}$, as shown in FIG. 8. In the illustrated example, $V_{TH3}$>$V_{TH2}$>$V_{TH1}$. One of those three levels may be selected by switch 802. These different levels of $V_{REF}$ may be produced under the same conditions to which PI 302 is subject to eliminate mismatches caused by process variation. For example, the different levels of $V_{REF}$ may be produced by another controllable current source that is configured to charge another capacitor within PI 302, as described in co-pending application Ser. No. 15/346,524, entitled "HIGH LINEARITY PHASE INTERPOLATOR", filed Nov. 8, 2016, the content of which is incorporated by reference herein.

Figure 9:
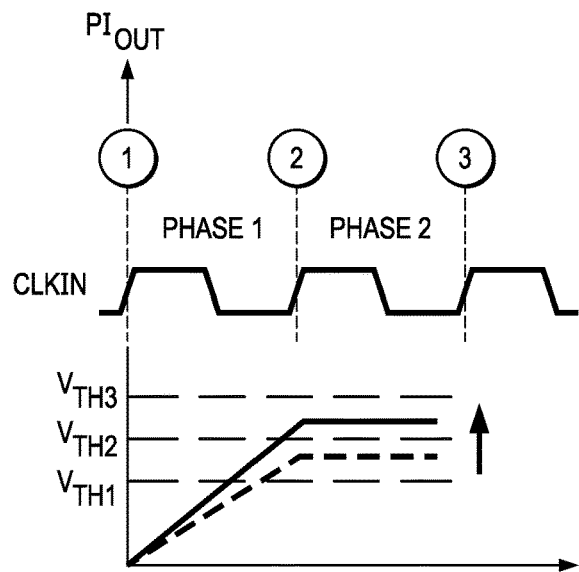

To calibrate the slope, DAC 312 sets α to full current value and capacitor C1 is charged during Phase 1, as shown in FIG. 9. Charging is switched off and the voltage of C1 is measured using comparator 310. Then, the maximum current $I_o$ and capacitance of capacitor C1 are adjusted such that comparator 310 trips at $V_{TH2}$ but not at $V_{TH3}$. These optimized values of $I_o$ and C1 are then stored, e.g., in an EEPROM or the like, which may be disposed in, or coupled to, digital calibration engine 304. In an example, calibration may be performed at different temperatures detected by an on-board temperature sensor to obtain values for different temperatures, thereby optimizing performance across a temperature range.

Figure 10:
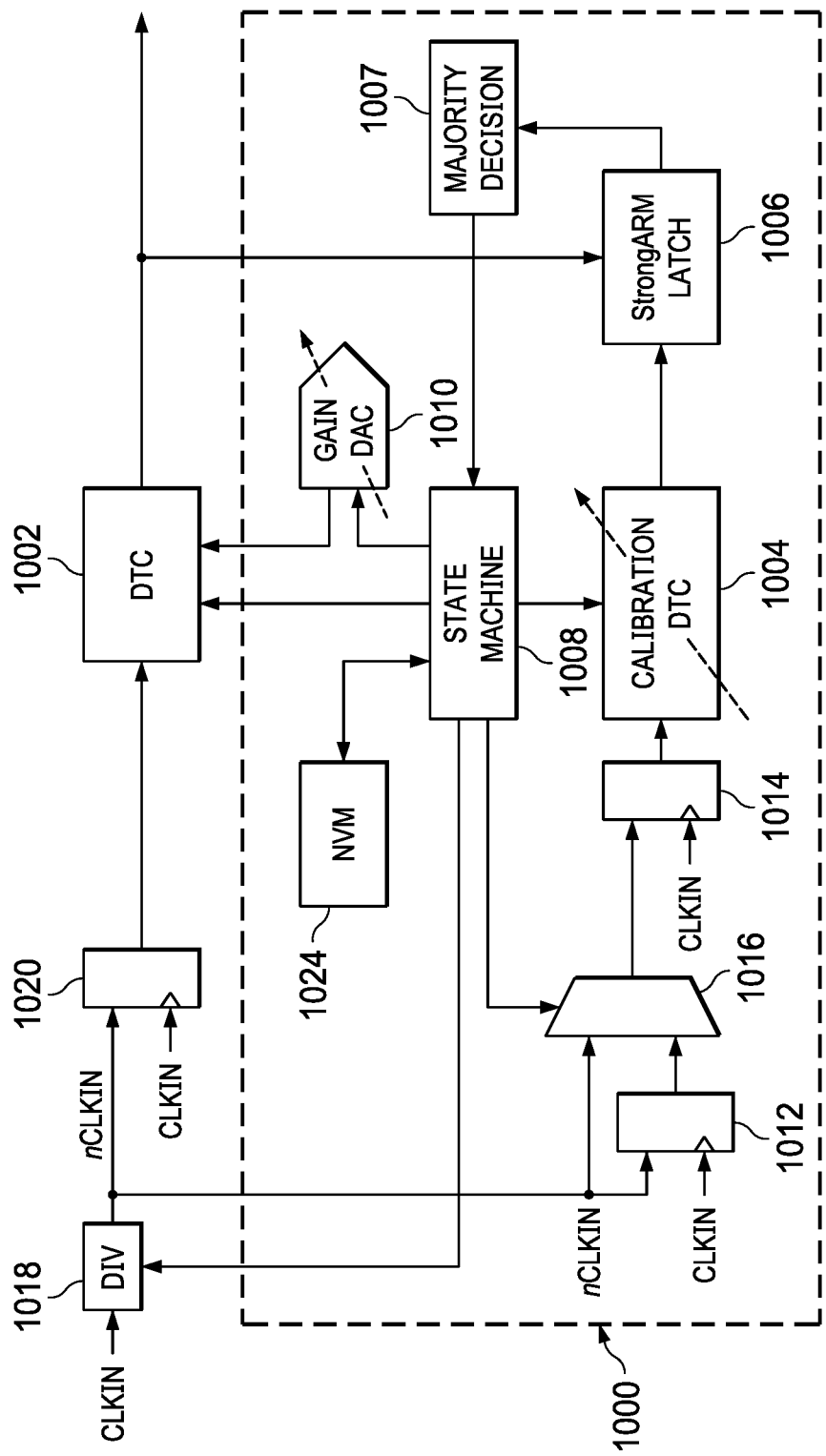
FIG. 10 is a schematic diagram of an example system that may be used to calibrate gain of an example DTC.

In calibrating gain, two sets of operations are performed, the first set being performed at 0 code and the second set being performed at full code. The two sets of operations are iteratively repeated until the correction code stabilizes, i.e., both edges of the signal are properly aligned. FIG. 10 is a schematic diagram of a gain calibration system 1000 that may be used to calibrate gain of a DTC 1002, which may correspond to DSDTC 300 of FIG. 3. Gain calibration system 1000 is coupled to DTC 1002 and configured such that gain of DTC 1002 is calibrated without effecting its operation.

Gain calibration system 1000 includes a calibration DTC 1004, a StrongArm latch 1006, a majority decision module 1007, a state machine 1008, an adjustable gain DAC 1010, delay (D) flip-flops 1012 and 1014, a multiplexer 1016, and an NVM 1024 coupled to state machine 1008.

Clock frequency divider circuit (DIV) 1018 has an input at which CLKIN is received and an output at which a signal nCLKIN is output under control of state machine 1008. The signal nCLKIN has a frequency that is a fraction or multiple of CLKIN, where n is a positive integer or fraction. nCLKIN is input to a D flip flop 1020 and D flip flop 1012 of gain calibration system 1000. Each flip flop 1020 and 1012 also receives CLKIN as an input. The output of flip flop 1020 is input to DTC 1002. The output of flip flop 1012 is input to multiplexer 1016, which also receives nCLKIN as an input. The output of multiplexer 1016 is controlled by state machine 1008. The selected output of multiplexer 1016 is input to flip flop 1014, which also receives CLKIN as an input. Thus, the signals input to DTC 1002 and calibration DTC 1004 are controlled by state machine 1008 in combination with clock frequency divider circuit (DIV) 1018, flip flops 1012, 1014 and 1020, and multiplexer 1016.

With DTC 1002 kept at 0 code, gain calibration system 1000 is configured such that the same edge of input clock signal (CLKIN), or nCLKIN, is input to DTC 1002 and a calibration DTC 1004 of gain calibration system 1000. The digital code of calibration DTC 1004 is then adjusted to align the edges of its output signal with the edges of the signal output by DTC 1002. This is done using StrongARM latch 1006, which has an input at which the output signal of DTC 1002 is received and another input at which the output signal of calibration DTC 1004 is received. StrongARM latch 1006 determines, for each pair of input signals received, which arrived first, and outputs the result to majority decision module 1007. Majority decision module 1007 considers multiple results from StrongArm latch 1006 in set time period and determines which signal, the output of DTC 1002 or the output of calibration DTC 1004, was received first by StrongArm latch 1006 a majority of the time. This decision by majority decision module 1007 is then output to state machine 1008.

With DTC 1002 at full code, calibration DTC 1004 is activated on an edge delayed by one cycle of CLKIN. The Phase 2 current of DTC 1002 is adjusted using adjustable gain DAC 1010, the output of which is coupled to an input of DTC 1002, to align gain DAC 1010 with calibration DTC 1004. The output of gain DAC 1010 is passed through DTC 1002, and the input of gain DAC 1010 is coupled to an output of state machine 1008, which controls gain DAC 1010. This is done using StrongArm latch 1006 and majority decision module 1007, under control of state machine 1008.

The two sets of operations, the first with DTC 1002 at 0 code and the second with DTC 1002 at full code, are repeated until the outputs of DTC 1002 and calibration DTC 1004 are properly aligned.

Figure 11:
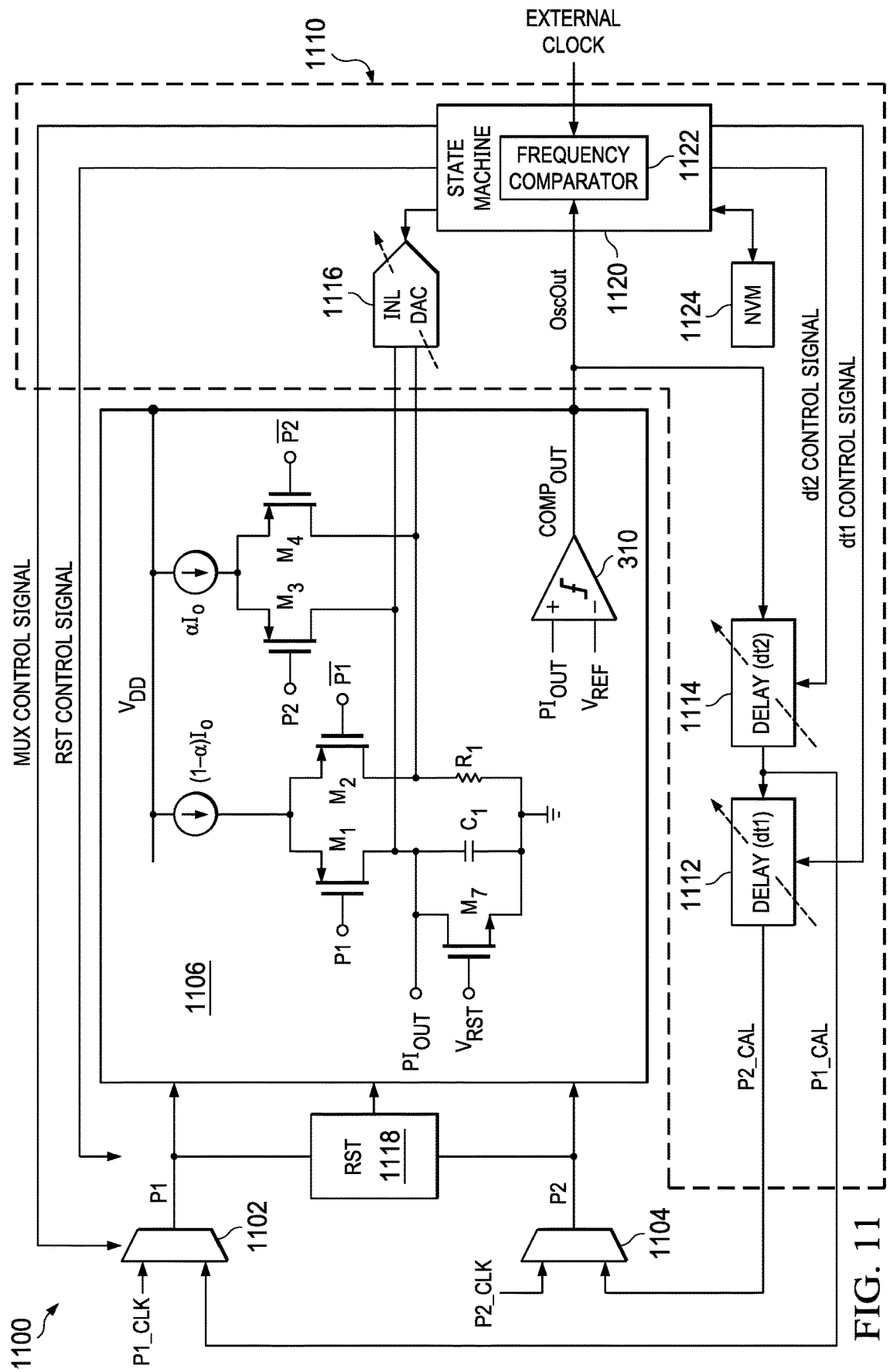
FIG. 11 is a schematic diagram of an example system used to calibrate INL of an example DTC.

In measuring integral nonlinearity (INL), the DTC, e.g., DSDTC 300, is configured as a relaxation oscillator 1100, as shown in FIG. 11, by coupling an INL calibration system 1110 to a phase interpolator (PI) 1106 of the DTC to generate signals with different phases: P1 and P2. PI 1106 may correspond to PI 302 of FIG. 3. Oscillator 1100 includes two input multiplexers 1102 and 1104, which output P1 and P2, respectively. The output of oscillator 1100 is the output of the comparator of PI 1106, which may correspond to comparator 310 of FIG. 3. In FIG. 11, that output is denoted OscOut.

INL calibration system 1110, which is used to execute the INL calibration, includes a delay block (dt1) 1112 and delay block (dt2) 1114, the latter of which has an input at which OscOut is received. Delay block (dt1) 1112 has an input coupled to an output of delay block (dt2) 1114. INL calibration system 1110 also includes an INL DAC 1116 coupled to PI 1106, and a reset (RST) component 1118 to clear and reset the generated waveform after each measurement of multiple time periods T. INL calibration system 1110 also includes a state machine 1120 which includes a frequency comparator 1122 that compares OscOut with an external clock signal. State machine 1120 has an output at which a dt1 control signal is output to delay block 1112 and an output at which a dt2 control signal is output to delay block 1114. State machine 1120 also has outputs at which RST control and multiplexer (Mux) control signals are output, respectively. State machine 1120 has another output coupled to an input of INL DAC 1116. Thus, state machine 1120 is configured to control delay 1112 and 1114, INL DAC 1116, reset component 1118, and multiplexers 1102 and 1104 based on comparison of OscOut with the external clock signal. INL calibration system 1110 also includes an NVM 1124 coupled to state machine 1120. NVM 1124 is used to store information relevant to the INL calibration as described below.

Delay block 1114 is controlled to bring OscOut to a desired frequency represented by a first calibration signal P1_CAL. Delay block 1112 is controlled to delay P1_CAL, received from delay block 1114, one period of CLKIN to generate a second calibration signal P2_CAL. P1_CAL is fed back to multiplexer 1102, which also receives a first clock signal P1_CLK. P2_CAL is fed back to multiplexer 1104, which also receives a second clock signal P2_CLK.

With the DTC configured as oscillator 1100, a is varied using INL DAC 1116 to change the time period of OscOut. Each of the multiple time periods T is then measured. Calibration is then performed such that T is linearly related to a. DAC 312 of FIG. 3 may be configured to implement INL DAC 1112.

Figure 12:
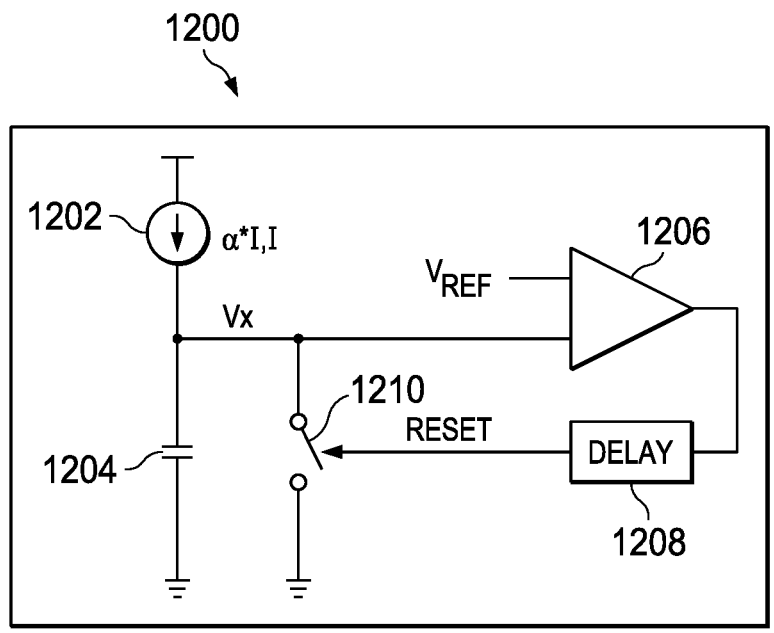
FIG. 12 is a circuit diagram of a simplified circuit to illustrate an example method of calibrating INL of an example DTC.
Figure 13:
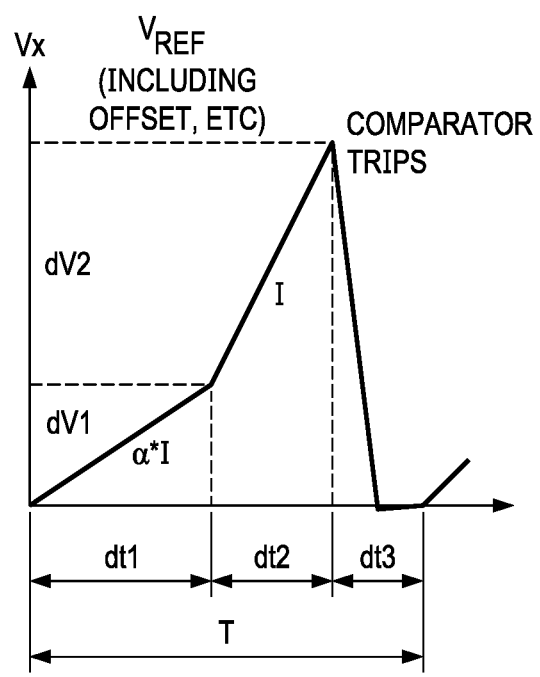
FIG. 13 is a graph illustrating operation of the circuit of FIG. 12.

Measurement of T for different values of a may be carried out as described below with reference to the circuit 1200 shown in FIG. 12, which is a simplified version of a portion of oscillator 1100 of FIG. 11. In each measurement sequence, a waveform, such as that shown in the voltage v. time graph shown in FIG. 13, is generated. Circuit 1200 includes a current source 1202, which represents both current sources of PI 1106 of FIG. 11, a capacitor 1204 with capacitance C, a comparator 1206 that has inputs to receive the charged voltage of capacitor 1204 (Vx corresponding to PI$_{OUT}$ in FIG. 11) and V$_{REF}$, and a delay 1208 representing both delays 1114 and 1116 of FIG. 11. The input of delay 1208 is coupled to the output of comparator 1206, and the output of delay 1208 is coupled to switch 1210 to reset circuit 1200 before each measurement is performed. Each value of a is determined according to Equation 1 below.

$$dV1 = \alpha * I * dt1/C; dV2 = I * dt2/C; \text{ and } dV1 + dV2 = V_{REF}$$

Thus, $\alpha * dt1 + dt2 = V_{REF} * C/I$

Since, $dt1 + dt2 + dt3 = T, dt2 = T - dt3 - dt1$

Thus, $\alpha * dt1 + (T - dt3 - dt1) = V_{REF} * C/I$ $\alpha = [V_{REF} * C/I - (T - dt3 - dt1)]/dt1$ $\alpha = (V_{REF} * C/I + dt3 + dt1)/dt1 - T/dt1$ (Equation 1)

For $\alpha = 1$, T1 is measured according to $V_{REF} * C/I + dt3$
For $\alpha = 0$, $dt1 = T0 - T1 \rightarrow$ measure
All a values can be now determined by measuring T.

That is, $\alpha = T0/(T0 - T1) - T/(T0 - T1)$ (Equation 2)

Equation 2 is applied to each of the time period measurements to estimate INL for each DTC digital code, which relationship may be expressed as a graph, e.g., as shown in FIG. 7. Based on the estimated INL of each DTC digital code, a corresponding code is calculated for INL DAC 1116 to provide additional current to remove INL. Each such calculated INL DAC code is stored in NVM 1124 for later use as described below.

Figure 14:
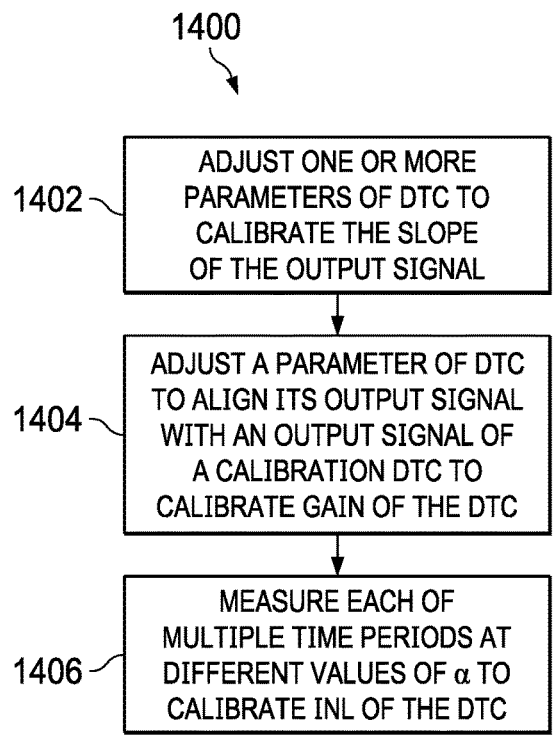
FIG. 14 is a flow diagram showing an example method of calibrating an example DTC.

FIG. 14 is a flow diagram of an example method 1400 of calibrating a DTC, e.g., DSDTC 300. In an example, the slope of the output signal of the DTC is calibrated first, then gain is calibrated, and then INL is calibrated.

In operation 1402, one or more parameters of the DTC are adjusted to calibrate the slope of the output signal of the DTC. The parameters may include a digital code that controls the current of a current source of the DTC, e.g., full code which sets full current in the DTC, and/or capacitance of a capacitor coupled to the current source. In operation

1404, a parameter of the DTC is adjusted to align the output signal of the DTC with an output signal of a calibration DTC to calibrate gain of the DTC. The parameter may be the digital code that controls the current of the current source. In operation 1406, INL is calibrated based on measurements of multiple time periods for different values of the digital code of the current source, e.g., α.

FIG. 14 depicts one possible order of operations to calibrate a DTC. Not all operations need necessarily be performed, nor need they be performed in the order described. Some operations may be combined into a single operation. Additional operations may be performed as well.

Figure 15:
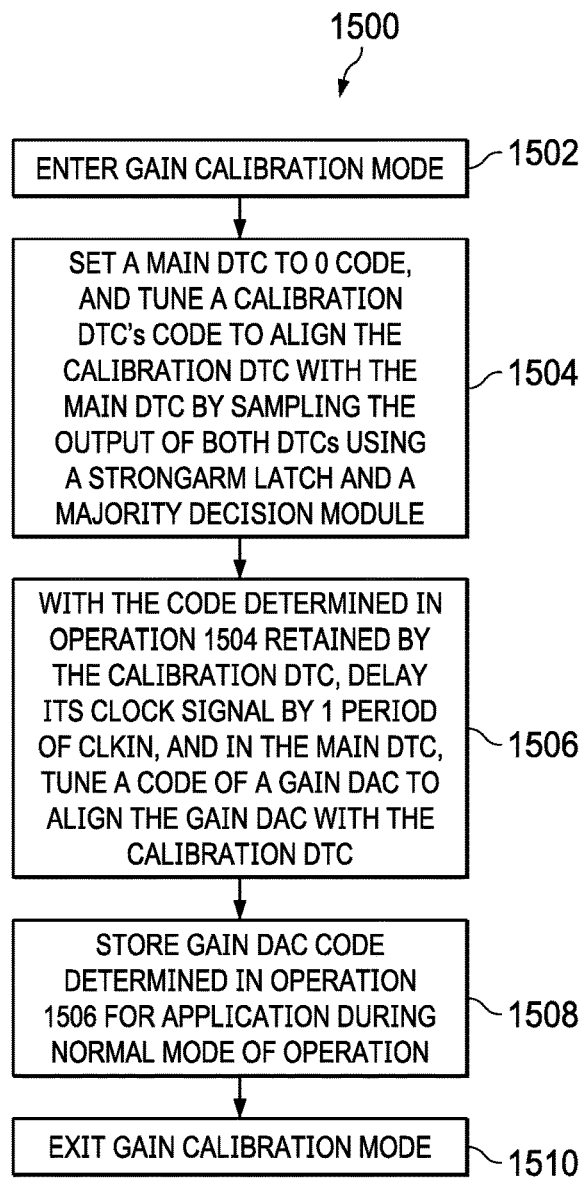
FIG. 15 is a flow diagram showing an example method of calibrating gain in an example DTC.

FIG. 15 is a flow diagram of an example method 1500 of calibrating gain of a DTC, e.g., DSDTC 1002, using a gain calibration system such as that depicted in FIG. 10. In operation 1502, the DTC enters gain calibration mode, and then a first alignment is performed (operation 1504), followed by a second alignment (operation 1506).

In operation 1504, a main DTC, e.g., DTC 1002, is set to 0 code, and the digital code of a calibration DTC, e.g., calibration DTC 1004, is tuned to align with that of the main DTC by sampling the output of both DTCs using a StrongArm latch, e.g., StrongArm latch 1006, in conjunction with a majority decision module, e.g., majority decision module 1007. As described above, the StrongArm latch identifies which output is received first. Multiple results from the StrongArm latch are then averaged by the majority decision module to determine which signal, the output of the main DTC or the output of the calibration DTC, was received first by the StrongArm latch a majority of the time to check alignment. From this, the digital code giving the best alignment is determined.

In the second alignment operation 1506, the calibration DTC retains the digital code from the first alignment operation 1504. Then, the clock signal of the calibration DTC is delayed by one period of CLKIN. In the main DTC, the digital code of a gain DAC, e.g., gain DTC 1010, is tuned to align with the calibration DTC using the StongArm latch and majority decision module as described above. The output of the gain DAC is passed through the main DTC to the StrongArm latch, which also receives the output of the calibration DTC. In this way, the digital code value of gain DAC that gives the best alignment is determined.

In operation 1508, the gain DAC digital code value determined in the second alignment operation 1506 is stored in NVM 1024, and that stored code is then applied during the normal mode of operation of the DTC. NVM 1024 may also be directly coupled to DTC 1002. Alternatively, the gain can be corrected digitally by multiplying the calibrated gain with each of the DTC digital codes with the use of appropriate hardware.

Gain calibration mode is then exited in operation 1510.

Figure 16:
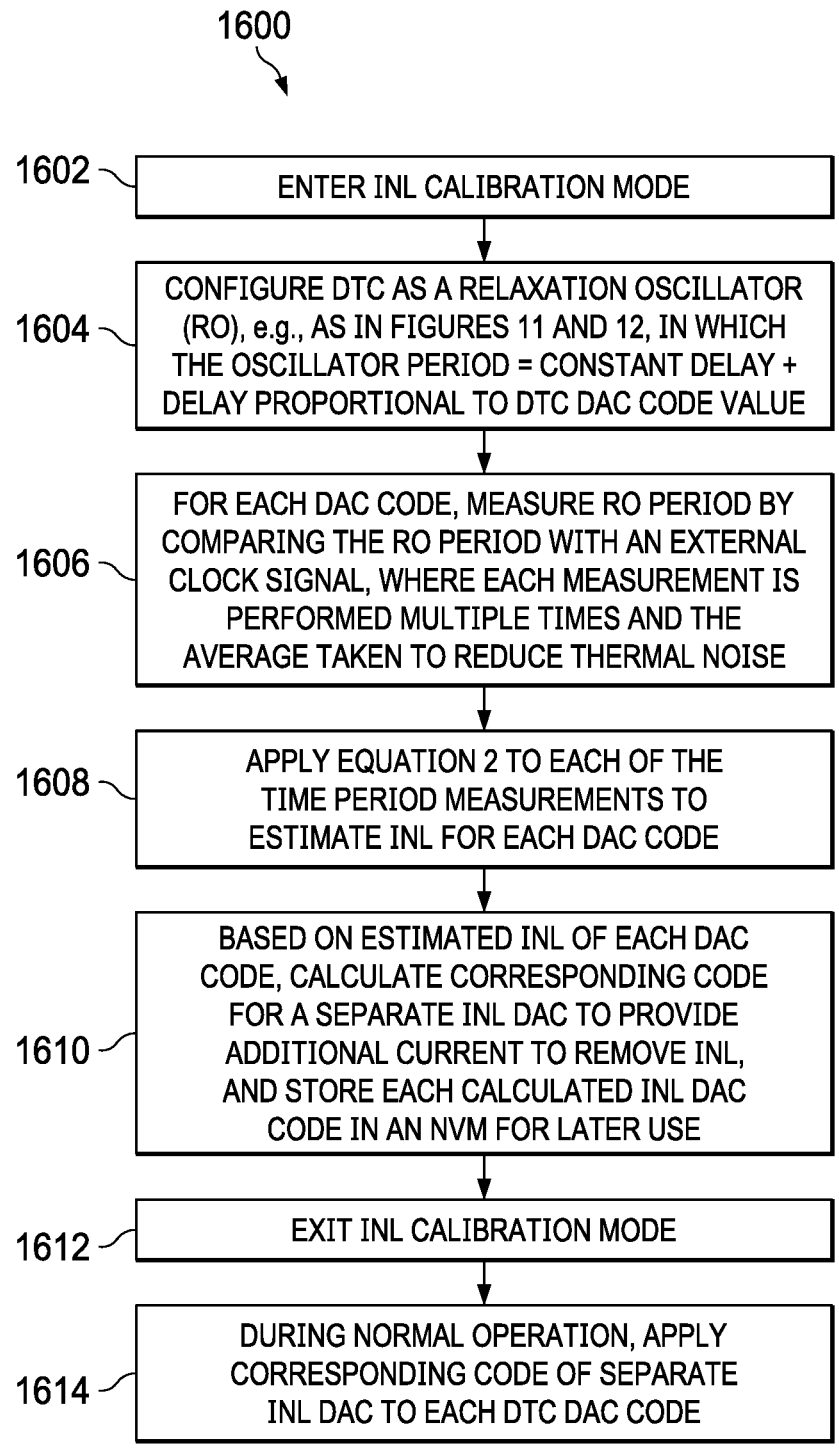
FIG. 16 is a flow diagram showing an example method of calibrating INL in an example DTC.

FIG. 16 is a flow diagram of an example method 1600 of calibrating INL of a DTC, e.g., DSDTC 300. In operation 1602, the DTC enters INL calibration mode. In operation 1604, the DTC is configured as a relaxation oscillator (RO), e.g., oscillator 1100, in which the oscillator period is equal to a constant delay plus a delay proportional to the DTC DAC digital code. In operation 1606, for each DAC digital code value, the RO period is measured by comparing the RO period with an external clock signal, e.g., using counters. Each measurement is performed multiple times, and the average of the multiple measurements is taken to reduce thermal noise.

In operation 1608, Equation 2 is applied to each of the time period measurements to estimate INL for each DAC code value to construct a relationship of INL vs. DTC code, which may be in the form of a graph, such as that shown in FIG. 7. In operation 1610, based on the estimated INL of each DAC code, corresponding code for a separate INL DAC, e.g., INL DAC 1116, is calculated to provide additional current to remove INL, and each calculated INL DAC code is stored in NVM 1124 for later use. Such information may be stored in compressed form to conserve storage space. The DTC exits INL calibration mode in operation 1612.

During normal operation of the DTC, the corresponding code of the separate INL DAC is applied to each DTC DAC code (operation 1614). To this end, the DTC is coupled, or has access, to NVM 1124.

Various examples of digitally calibrating a DTC are illustrated and described. While techniques for such calibration are disclosed primarily in the context of a DTC with dual-slope architecture, such techniques may be applied to other DTC architectures. Digitally calibrating slope, gain and INL of a DTC, e.g., a dual-slope DTC, according to examples provided herein, improves performance of the DTC, particularly in environments in which high accuracy is desired. In examples, such calibration reduces or mitigates nonlinearity that arises because of static and dynamic effects of current source and switch characteristics, as well as mismatch.

The term "coupled" is used throughout the specification. The term and derivatives thereof may cover connections, communications, or signal paths that enable a functional relationship consistent with this description. For example, if device A provides a signal to control device B to perform an action, in a first example device A is coupled to device B, or in a second example device A is coupled to device B through intervening component C if intervening component C does not substantially alter the functional relationship between device A and device B such that device B is controlled by device A via the control signal provided by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors is described herein, other transistors (or equivalent devices) may be used instead. For example, a p-type metal-oxide-silicon FET ("MOSFET") may be used in place of an n-type MOSFET and vice versa with little or no changes to the circuit. Furthermore, other types of transistors may be used (such as bipolar junction transistors (BJTs)).

Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means +/−10 percent of the stated value.

Modifications of the described examples are possible, as are other examples, within the scope of the claims. Moreover, features described herein may be applied in other environments and applications consist with the teachings provided.

What is claimed is:

1. A method of calibrating a digital-to-time converter (DTC), the method comprising:
    calibrating a slope of a voltage signal of the DTC including charging a capacitor using a current source set according to a control value set at a first digital code value for a first phase, stop charging the capacitor, comparing the voltage signal with a reference voltage signal using a comparator, and adjusting at least one of capacitance of the capacitor and maximum current of the current source to configure the comparator to output a signal during a second phase when the reference voltage signal is at or above a first level and below a second level which is higher than the first level;
    calibrating a gain of the DTC including adjusting a time difference between output of the comparator when the control value is set at the first digital code value and output of the comparator when the control value is set at a second digital code value to be one period of a clock signal input to the DTC; and
    calibrating integral nonlinearity (INL) of the DTC including measuring a time period for each of multiple digital code values of the DTC.

2. The method of claim 1, wherein the first digital code value sets the current source to maximum current.

3. The method of claim 2, wherein the first phase is one period of the clock signal.

4. The method of claim 1, wherein the calibrating of the gain of the DTC includes:
    setting the control value to the first digital code value; and
    inputting the clock signal to the DTC and a calibration DTC; and
    adjusting a digital code of the calibration DTC to align an edge of the clock signal input to the calibration DTC with a corresponding edge of the clock signal input to the DTC.

5. The method of claim 4, wherein the adjusting of the digital code of the calibration DTC includes:
    measuring a time difference between output of a DTC gain signal and output of a calibration DTC gain signal.

6. The method of claim 4, wherein the calibrating of the gain of the DTC includes:
    delaying activation of the calibration DTC by one clock period;
    setting the control value to the second digital code value; and then
    adjusting the current generated by the current source in the second phase to align the clock signals input to the DTC and the calibration DTC.

7. The method of claim 1, wherein the calibrating of the INL of the DTC includes:
    configuring the DTC as an oscillator in which a period of the oscillator is equal to a sum of a constant delay and a delay proportional to a digital code value of the DTC, the oscillator generating a first calibration signal and a second calibration signal having a different phase than the first calibration signal; and
    measuring a time period representing one cycle of charging and discharging the capacitor for each of multiple control values.

8. The method of claim 7, wherein the first calibration signal is delayed one period of the clock signal.

9. The method of claim 8, wherein the second calibration signal is adjusted to a desired frequency.

10. A digital-to-time converter (DTC), comprising:
    a phase interpolator including a current source and a charging element; and
    a digital calibration engine coupled to the phase interpolator, the digital calibration engine including a digital-to-analog converter to set a value of a digital code of the DTC to any of multiple values between 0 code and full code to control the current source during digital calibration of a slope of a voltage signal of the DTC, gain of the DTC, and integral nonlinearity (INL) of the DTC.

11. The DTC of claim 10, comprising:
    a comparator configured to compare a voltage signal of the DTC with a reference voltage signal in calibrating the DTC; and
    a switch to set the reference voltage to one of multiple values.

12. A system comprising:
    a digital-to-time converter (DTC) having an input at which a first clock signal is received and an output at which a DTC output signal is output;
    a calibration DTC having an input at which a second clock signal is received and an output at which a calibration DTC output signal is output;
    a latch comparator having inputs at which the DTC and calibration DTC output signals are received, respectively, and an output at which a comparative signal indicative of which of the DTC output signal and the calibration DTC output signal is received first; and
    a state machine having an input at which the comparative signal is received, the state machine being configured to control the DTC and calibration DTC based on the comparative signal.

13. The system of claim 12, comprising:
a majority decision module having an input at which the comparative signal is received and an output coupled to the input of the state machine.

14. The system of claim 12, comprising:
a digital-to-analog converter (DAC) coupled to the DTC to adjust the frequency of the DTC output signal.

15. The system of claim 14, wherein the state machine is operably coupled to the DAC.

16. The system of claim 12, wherein the state machine is configured to control the frequency of each of the first and second clock signals.

17. A system comprising:
a phase interpolator having a current source and an output at which an oscillation signal is output;
a first delay having an input coupled to the output of the phase interpolator and an output at which a first calibration signal output;
a second delay having an input coupled to the output of the first delay and an output at which a second calibration signal is output, the second calibration signal being delayed by a set amount relative to the first calibration signal; and
a digital-to-analog converter (DAC) coupled to the phase interpolator, the DAC being configured to vary a digital code that controls the current source to change the period of the oscillation signal during calibration.

18. The system of claim 17, comprising:
a first multiplexer having a first calibration signal input, a first clock signal input, and an output at which a signal having a first phase is output; and
a second multiplexer having a second calibration signal input, a second clock signal input, and an output at which a signal having a second phase is output.

19. The system of claim 18, wherein the phase interpolator has an input at which the signal having the first phase is input and an input at which the signal having the second phase is input.

20. The system of claim 17, comprising:
a state machine having an input coupled to the output of the phase interpolator, a first output at which a first delay control signal is output to control the first delay, and a second output at which a second delay control signal is output to control the second delay.

21. The system of claim 20, wherein the state machine has a third output coupled to an input of the DAC.

* * * * *